(12) United States Patent
Colombi

(10) Patent No.: US 9,927,466 B2
(45) Date of Patent: Mar. 27, 2018

(54) SYSTEM AND METHOD FOR CONTROLLING DYNAMIC OUTPUT IMPEDANCE OF AN INVERTER

(71) Applicant: General Electric Company, Schenectady, NY (US)

(72) Inventor: Silvio Colombi, Losone (CH)

(73) Assignee: General Electric Company, Schenectady, NY (US)

( * ) Notice: Subject to any disclaimer, the term of this patent is extended or adjusted under 35 U.S.C. 154(b) by 296 days.

(21) Appl. No.: 14/799,401

(22) Filed: Jul. 14, 2015

(65) Prior Publication Data

US 2015/0318737 A1 Nov. 5, 2015

Related U.S. Application Data

(63) Continuation-in-part of application No. 13/738,688, filed on Jan. 10, 2013, now Pat. No. 9,588,182.

(30) Foreign Application Priority Data

Jul. 6, 2012 (IT) ................. MI2012A1191

(51) Int. Cl.
*H02J 7/00* (2006.01)
*H02J 9/00* (2006.01)
(Continued)

(52) U.S. Cl.
CPC .......... *G01R 19/2509* (2013.01); *H02M 7/48* (2013.01); *G01R 31/42* (2013.01); *H02M 2001/0009* (2013.01); *Y10T 307/625* (2015.04)

(58) Field of Classification Search
CPC ....................... H02M 7/48; H02M 2001/0009; G01R 31/42; G01R 19/2509; Y10T 307/625
See application file for complete search history.

(56) References Cited

U.S. PATENT DOCUMENTS 4,060,752 A 11/1977 Walker
4,071,812 A 1/1978 Walker
(Continued)

FOREIGN PATENT DOCUMENTS

EP 0652445 A2 5/1995
EP 0747715 A2 12/1996
(Continued)

OTHER PUBLICATIONS

Deng et al., "A Simple Control Method for High-Performance UPS Inverters Through Output-Impedance Reduction," Industrial Electronics, IEEE Transactions on, vol. 55, No. 2, pp. 888,898, Feb. 2008.
(Continued)

*Primary Examiner* — Jared Fureman
*Assistant Examiner* — Esayas Yeshaw
(74) *Attorney, Agent, or Firm* — General Electric Company

(57) ABSTRACT

A control circuit is described herein. The control circuit includes an oscillator and a processor. The oscillator is configured to generate a reference signal. The processor is coupled to the oscillator. The processor is configured to receive a first output current sample, a second output current sample, and a third output current sample, all of an output current. The first output current sample is first-in-time, the second output current sample is second-in-time, and the third output current sample is third-in-time. The processor is further configured to compute a time-derivative of the output current. The processor is further configured to compute a command variable based on the reference signal, a time-derivative of the reference signal, the third output current sample, and the time-derivative of the output current.

13 Claims, 2 Drawing Sheets

(51) Int. Cl.
  *G01R 19/25*  (2006.01)
  *H02M 7/48*   (2007.01)
  *G01R 31/42*  (2006.01)
  *H02M 1/00*   (2006.01)

(56) References Cited

U.S. PATENT DOCUMENTS

| | | |
|---|---|---|
| 4,346,332 A | 8/1982 | Walden |
| 5,731,965 A | 3/1998 | Cheng et al. |
| 5,757,099 A | 5/1998 | Cheng et al. |
| 7,372,177 B2 | 5/2008 | Colombi et al. |
| 7,768,805 B2 | 8/2010 | Colombi et al. |
| 7,932,693 B2 | 4/2011 | Lee et al. |

FOREIGN PATENT DOCUMENTS

| | | |
|---|---|---|
| EP | 2056116 A1 | 5/2009 |
| WO | 2008067787 A1 | 6/2008 |
| WO | 2011024137 A1 | 3/2011 |

OTHER PUBLICATIONS

Ryan et al., "A high performance sine wave inverter controller with capacitor current feedback and "back-EMF" decoupling," Power Electronics Specialists Conference, 1995. PESC '95 Record., 26th Annual IEEE , vol. 1, pp. 507-513 vol. 1, Jun. 18-22, 1995.

Abdennadher et al., "A Real-Time Predictive-Maintenance System of Aluminum Electrolytic Capacitors Used in Uninterrupted Power Supplies," Industry Applications, IEEE Transactions on , vol. 46, No. 4, pp. 1644-1652, Jul.-Aug. 2010.

Lee et al., "Online capacitance estimation of DC-link electrolytic capacitors for three-phase AC/DC/AC PWM converters using recursive least squares method," Electric Power Applications, IEE Proceedings , vol. 152, No. 6, pp. 1503-1508, Nov. 4, 2005.

Imam et al., "Condition Monitoring of Electrolytic Capacitor in Power Electronic Circuits using Adaptive Filter Modeling," Power Electronics Specialists Conference, 2005. PESC '05. IEEE 36th,pp. 601-607, Jun. 16-16, 2005.

SYSTEM AND METHOD FOR CONTROLLING DYNAMIC OUTPUT IMPEDANCE OF AN INVERTER

CROSS-REFERENCE TO RELATED APPLICATIONS

This application is a continuation in part of U.S. patent application Ser. No. 13/738,688, filed on Jan. 10, 2013, which claims the benefit of and priority to Italian Patent Application No. MI2012A001191, filed on Jul. 6, 2012, both of which are hereby incorporated herein by reference.

BACKGROUND

The present application relates generally to uninterruptible power supplies (UPSs), and more specifically, to a controller for an inverter circuit and a method of use thereof.

Modern power electronic systems, such as uninterruptible power supplies (UPSs), use switched converters coupled with LC filters to remove high-frequency components. The switched converters have an output impedance that represents the ability of the switched converter to maintain a target output voltage under varying load conditions. This is sometimes referred to as output dynamic stiffness. For example, in certain fields, the load varies non-linearly, as in a typical computer load. In other fields, such as medical imaging, the load pulses, in which case a higher output dynamic stiffness is preferred. For a given load, the output dynamic stiffness of an inverter can be characterized by a voltage total harmonic distortion (THD), which is expressed as a percentage. An ideal inverter has zero output impedance and a THD of 0%. The voltage THD is not an absolute measure of dynamic stiffness. Voltage THD allows a comparison of performance of various inverters for a same load, for example, the full non-linear load according to IEC 62040-3.

Output dynamic stiffness is typically a function of control strategy, modulation, DC-link voltage, and design of the inverter filter. In transformer-based UPS systems, the coupling of transformer windings is an additional factor.

BRIEF DESCRIPTION

In one aspect, a control circuit is provided. The control circuit includes an oscillator and a processor. The oscillator is configured to generate a reference signal. The processor is coupled to the oscillator. The processor is configured to receive a first output current sample, a second output current sample, and a third output current sample, all of an output current. The first output current sample is first-in-time, the second output current sample is second-in-time, and the third output current sample is third-in-time. The processor is further configured to compute a time-derivative of the output current. The processor is further configured to compute a command variable based on the reference signal, a time-derivative of the reference signal, the third output current sample, and the time-derivative of the output current.

In another aspect, a method of controlling an inverter circuit is provided. The method includes receiving three output current samples of an output current. The method further includes computing a time-derivative of the output current based on the three output current samples. The method further includes generating a command variable based on the reference signal, the time-derivative of the reference signal, the output current, and the time-derivative of the output current. The method further includes operating the inverter circuit based on the command variable.

In yet another aspect, an uninterruptible power supply (UPS) is provided. The UPS includes an inverter, a filter, and a controller. The inverter is configured to produce an alternating current (AC) signal. The filter is configured to receive the AC signal and to produce an output voltage for a time-varying load. The controller is configured to compute a first time-derivative of an output current measurement and a commanded voltage for the inverter based on the first time-derivative of the output current.

DETAILED DESCRIPTION

Exemplary embodiments of a control circuit for a uninterruptible power supply and methods of use are described herein. In an exemplary embodiment, a commanded voltage for a UPS inverter is computed based on an output current and a time-derivative of the output current. More specifically, the time-derivative of the output current is computed using three samples of the output current taken over time. The output current and the time-derivative of the output current are used in combination with an output voltage, a bridge current, a reference signal, and a time-derivative of the reference signal. Further, each of the terms in the control system have respective gains applied when computing the commanded voltage for the inverter.

Figure 1:
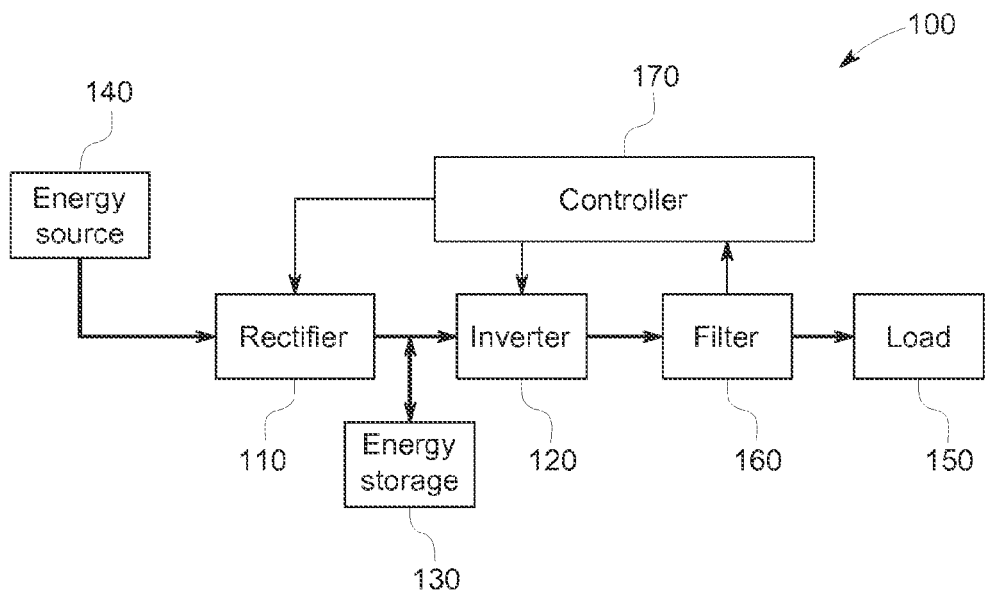
FIG. 1 is a block diagram of one embodiment of an uninterruptible power supply (UPS)

FIG. 1 is a block diagram of one embodiment of an uninterruptible power supply (UPS) 100. UPS 100 includes a rectifier 110, an inverter 120, and an energy storage device 130. UPS 100 is configured to receive power from an energy source 140 at rectifier 110. Rectifier 110 is configured to generate DC power from the received power. The DC power can be used to charge energy storage device 130. The DC power can also be converted to AC power by inverter 120 to supply a load 150. AC power provided by inverter 120 is passed through a filter 160 to remove high frequency components from the output voltage to be delivered to load 150.

Inverter 120 is a switched device, such as a switched square wave voltage source, for example, configured to produce a stable AC voltage output to supply load 150. UPS 100 includes a controller 170 configured to control the switching of inverter 120 to achieve a demanded voltage for load 150. Load 150, in certain embodiments, is a time varying load, such as a medical imaging system. Such a load causes an output current of UPS 100 to pulse, which can distort the output voltage depending on the bandwidth of controller 170. Controller 170 uses various signals, samples, and measurements from the output of inverter 120 to control inverter 120 and command a voltage output. In certain embodiments, controller 170 is further configured to control rectifier 110.

Figure 2:
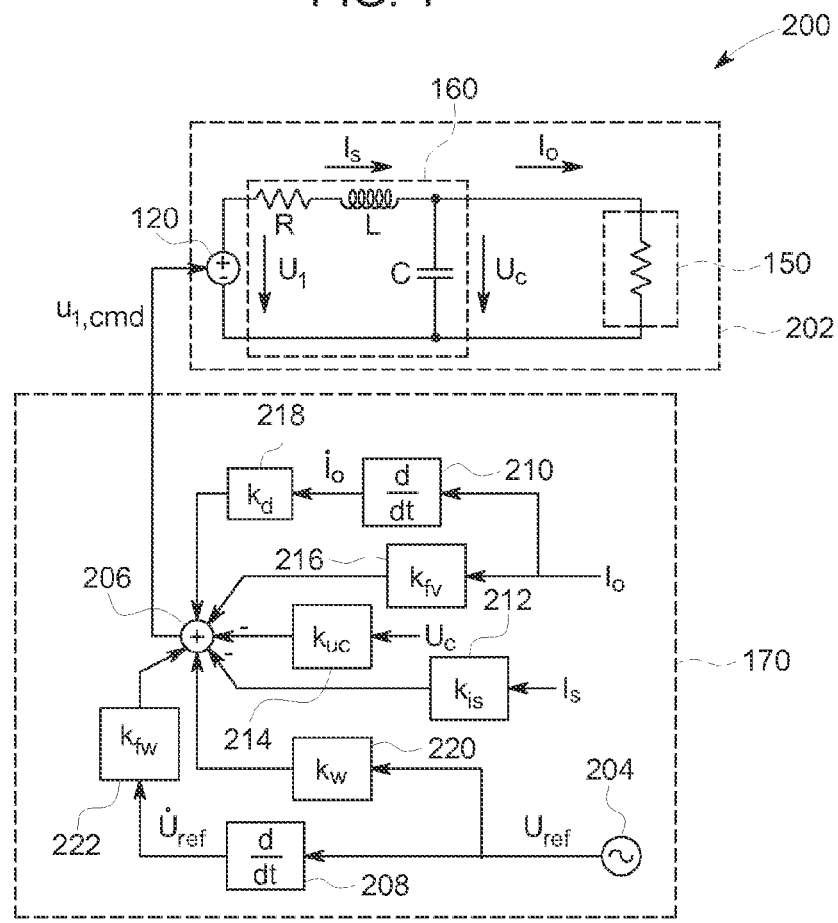
FIG. 2 is a schematic diagram of one embodiment of a UPS output stage.

FIG. 2 is a schematic diagram of one embodiment of a UPS output stage 200. UPS output stage 200 includes inverter 120, filter 160, and controller 170 (all shown in FIG. 1). Controller 170 is configured to control inverter 120 to provide a demanded sinusoidal voltage to load 150 (also shown in FIG. 1). Filter 160 is configured to filter high-frequency voltage harmonics of inverter 120. Controller 170, in certain embodiments, comprises a digital controller. In alternative embodiments, controller 170 comprises an analog circuit.

Inverter 120, filter 160, and load 150 are illustrated in an equivalent circuit 202. Inverter 120 is depicted as a controlled voltage source that produces a voltage $U_1$ and a bridge current $I_s$. Filter 160 includes a series resistor R, a series inductor L, and a parallel capacitor C. In equivalent circuit 202, resistor R generally represents an inherent resistance, R, such as a parasitic resistance, of inductor L. Load 150 is coupled to UPS output stage 200 in parallel to capacitor C of filter 160. An output voltage $U_c$ is provided across capacitor C. An output current Io is provided to load 150, which is a function of load 150, output voltage $U_c$, bridge current $I_s$, and the voltage $U_1$, among other parameters. These parameters are measured, or sampled, over time during operation of UPS output stage 200 to obtain discrete feedback and feedforward terms. The samples are received by controller 170 and used to compute the command variable $u_{1,cmd}$. Inverter 120 generates voltage $U_1$ based on the command variable $u_{1,cmd}$. Command variable $u_{1,cmd}$, in certain embodiments, is a voltage level used to control inverter 120. For example, inverter 120 may apply a modulation process based on command variable $u_{1,cmd}$ to generate voltage $U_1$.

Controller 170 includes an oscillator 204 that is configured to generate a reference signal $U_{ref}$. Controller 170 is further configured to use reference signal $U_{ref}$ in computing the command variable $u_{1,cmd}$.

Controller 170 includes a control system that sums, at summer 206, the various feedback and feedforward terms to arrive at the command variable $u_{1,cmd}$. The feedback and feedforward terms are designated in time by a [k] term. For example, x[k] represents a $k^{th}$, or current, sample of the variable x; whereas x[k−1] represents the preceding sample, in time, of variable x and x[k+1] represents the next sample in time.

Certain feedback and feedforward terms are sampled directly from filter 160, such as bridge current $I_s$, output current $I_o$, and output voltage $U_c$. Other feedback and feedforward terms are generated within controller 170 originally or are conditioned in some manner within controller 170. For example, reference signal $U_{ref}$ is generated within controller 170 by oscillator 204. In alternative embodiments, oscillator 204 is implemented outside controller 170 and is provided to controller 170 as an input. Controller 170 also uses a first time-derivative of reference signal $U_{ref}$, $\dot{U}_{ref}$. $\dot{U}_{ref}$ is obtained by passing reference signal $U_{ref}$ through a derivative block 208. Likewise, controller 170 uses a first time-derivative of output current $I_o$, $$\frac{dI_o}{dt}, \frac{dI_o}{dt}$$

is obtained by passing output current $I_o$ through a derivative block 210. In some embodiments, the derivative $\dot{U}_{ref}$ of the reference signal $U_{ref}$ is computed directly, such as, for example, when $U_{ref}$ is a sinusoidal signal stored in a look-up table, the cosinusoidal signal can also be extracted from the same look-up table.

Controller 170 also includes amplifiers 212, 214, 216, 218, 220, and 222 respectively configured to apply a gain to the feedback and feedforward terms. More specifically, amplifier 212 applies a gain $k_{is}$ to the bridge current $I_s$, amplifier 214 applies a gain $k_{uc}$ to the output voltage $k_{is}$, amplifier 216 applies a gain $k_{fv}$ to the output current $I_o$, amplifier 218 applies a gain $k_d$ to the first time-derivative of output current $$\frac{dI_o}{dt},$$

amplifier 220 applies a gain $k_w$ to reference signal $U_{ref}$, and amplifier 222 applies a gain $k_{fw}$ to the first time-derivative of reference signal $U_{ref}$, $\dot{U}_{ref}$. Gains $k_{fw}$, $k_w$, $k_{is}$, $k_{uc}$, $k_{fv}$, and $k_d$ are computed in advance and are retrievable from memory within controller 170. In alternative embodiments, at least one of gains $k_{fw}$, $k_w$, $k_{is}$, $k_{uc}$, $k_{fv}$, and $k_d$ is computed at run-time, while controller 170 is controlling inverter 120.

Controller 170 is configured to compute commanded voltage $U_1$ according to the equation:

$$U_1[k] = k_w U_{ref}[k] + k_{fw}\dot{U}_{ref}[k] - k_{uc}U_c[k] - k_{is}I_s[k] + k_{fv}I_o[k] + k_d\frac{dI_o}{dt}[k]$$

Derivative block 210 is configured to compute $$\frac{dI_o}{dt}$$

based on three samples of output current $I_o$: $I_o[k]$, $I_o[k-1]$, and $I_o[k-2]$. More specifically, derivative block 210 uses the equation:

$$\frac{dI_o}{dt}[k] \approx \frac{2 \cdot I_o[k] - 3 \cdot I_o[k-1] + I_o[k-2]}{T_E}$$

In an alternative embodiment, derivative block 210 is configured to compute $$\frac{dI_o}{dt}$$

based on a measured voltage $V_L$ across an auxiliary inductance $L_{aux}$ coupled in series with load 150. The voltage $V_L$ across the inductance $L_{aux}$ is proportional to the derivative of the output current $$\frac{dI_o}{dt},$$

as is illustrated in me following equation:

$$\frac{dI_o}{dt} = \frac{1}{L_{aux}}V_L$$

Figure 3:
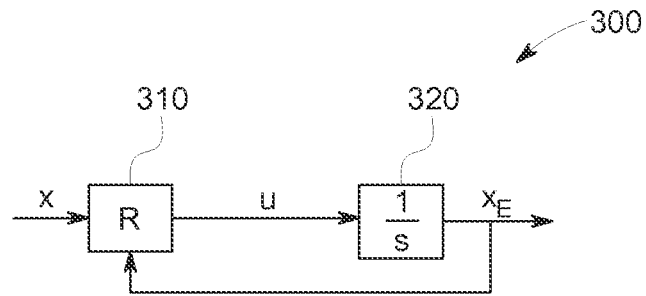
FIG. 3 is a block diagram of one embodiment of a closed loop system.

FIG. 3 is a block diagram of one embodiment of a closed loop system 300 for use in UPS 100 and 200 (shown in FIGS. 1 and 2). Closed loop system 300 includes a controller 310 that controls an integrator 320. A variable x is measured and input to controller 310. In controller 170, variable x represents output current $I_o$. Controller 310 is configured for a variable $x_E$ to track measured variable x. A command variable u is then the desired derivative estimate.

Figure 4:
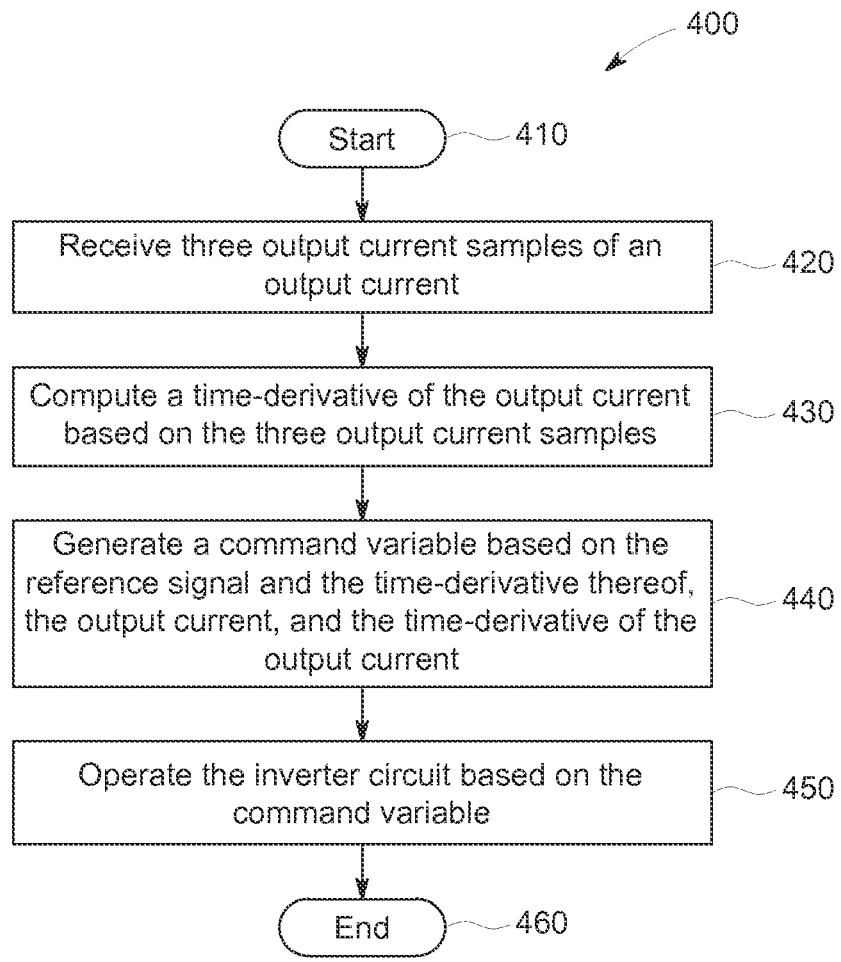
FIG. 4 is a flow diagram of one embodiment of a method of controlling an inverter circuit.

FIG. 4 is a flow diagram of one embodiment of a method 400 of controlling an inverter circuit, such as inverter 120 (shown in FIGS. 1 and 2), using a controller, such as controller 170 (also shown in FIGS. 1 and 2). Method 400 begins at a start step 410.

At a receiving step 420, three sample of an output current, such as $I_o$ (shown in FIG. 2), are received at controller 170. The three samples are taken over a period of time. Using the three output current samples, at a computing step 430, a time-derivative of the output current is computed. At a generating step 440, the time-derivative of the output current is used in combination with the reference signal, the time-derivative of the reference signal, and the output current to generate a command variable, such as $u_{1,cmd}$. Inverter circuit 120 is then operated, at an operating step 450, based on the command variable. The method then ends at an end step 460.

A technical effect of the methods and systems described herein may include one or more of: (a) improving derivative accuracy and latency; (b) improving dynamic stiffness of the inverter; (c) lowering total harmonic distortion in the output voltage of the inverter under non-linear or pulsating loads; (d) reducing the capacitance value in the LC filter of the inverter due to improved dynamic stiffness; and (e) reducing cost and improving reliability and performance due to the reduced capacitance value in the LC filter.

Exemplary embodiments of a control circuit and methods of controlling an inverter circuit are described above in detail. The control circuit and methods are not limited to the specific embodiments described herein but, rather, components of the control circuit and/or operations of the methods may be utilized independently and separately from other components and/or operations described herein. Further, the described components and/or operations may also be defined in, or used in combination with, other systems, methods, and/or devices, and are not limited to practice with only the control circuit as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A control circuit, comprising:
   an oscillator configured to generate a reference signal; and
   a processor coupled to said oscillator and configured to:
      receive a first output current sample, a second output current sample, and a third output current sample, wherein the first, second, and third samples are samples of an output current,
      compute a time-derivative of the output current based on the samples, and
      compute a command variable based on the reference signal, a time-derivative of the reference signal, the output current, and the time-derivative of the output current, and
      operate an inverter circuit based on the command variable.

2. The control circuit of claim 1, wherein said processor is further configured to apply respective gains to the reference signal, the time-derivative of the reference signal, the output current, and the time-derivative of the output current.

3. The control circuit of claim 1, wherein said processor is further configured to receive an output voltage sample and a bridge current sample.

4. The control circuit of claim 3, wherein said processor is further configured to compute the command variable based on the output voltage sample and the bridge current sample.

5. The control circuit of claim 1, wherein said processor comprises a state controller for computing the time-derivative of the output current.

6. The control circuit of claim 1, wherein said processor is further configured to compute the time-derivative of the output current based on the first output current sample, the second output current sample, and the third output current sample.

7. A method of controlling an inverter circuit, said method comprising:
   receiving three output current samples of an output current;
   computing a time-derivative of the output current based on the three output current samples;
   generating a command variable based on the reference signal and time-derivative thereof, the output current, and the time-derivative of the output current; and
   operating the inverter circuit based on the command variable.

8. The method of claim 7 further comprising receiving a sample of a bridge current supplied by the inverter circuit.

9. The method of claim 8, wherein generating the command variable is further based on the sample of the bridge current.

10. The method of claim 7 wherein computing the time-derivative of the output current comprises calculating $(2x[k]-3x[k-1]+x[k-2])/T$, wherein:
   $x[k]$ is a last-in-time sample of the three output current samples,
   $x[k-1]$ is a second-to-last-in-time sample of the three output current samples,
   $x[k-2]$ is a third-to-last-in-time sample of the three output current samples, and
   T is a time period over which the three output current samples are taken.

11. The method of claim 7 further comprising amplifying the reference signal, the time derivative of the reference signal, the output current, and the time-derivative of the output current using respective gains.

12. The method of claim 11 further comprising retrieving the respective gains from a non-transitory memory device.

13. The method of claim 7 wherein computing the time-derivative of the output current comprises employing a state controller.

* * * * *